(12) United States Patent
Shimizu et al.

(10) Patent No.: US 6,912,236 B2
(45) Date of Patent: Jun. 28, 2005

(54) SEMICONDUCTOR LASER DEVICE HAVING LOWER THRESHOLD CURRENT

(75) Inventors: Hitoshi Shimizu, Tokyo (JP); Koji Kumada, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 283 days.

(21) Appl. No.: 09/918,018

(22) Filed: Jul. 30, 2001

(65) Prior Publication Data

US 2002/0034203 A1 Mar. 21, 2002

(30) Foreign Application Priority Data

Jul. 31, 2000 (JP) .................................... 2000-230553
Apr. 23, 2001 (JP) .................................... 2001-124300

(51) Int. Cl.$^7$ ............................................. H01S 5/00
(52) U.S. Cl. ........................ 372/43; 372/39; 372/45
(58) Field of Search ........................ 372/39, 43, 50, 372/45, 46, 96; 257/85, 87

(56) References Cited

U.S. PATENT DOCUMENTS

| | | | |
|---|---|---|---|
| 5,383,211 A | * 1/1995 | Van de Walle et al. | ....... 372/43 |
| 5,689,123 A | 11/1997 | Major et al. | |
| 5,719,894 A | 2/1998 | Jewell et al. | |
| 5,719,895 A | 2/1998 | Jewell et al. | |
| 5,825,796 A | 10/1998 | Jewell et al. | |
| 5,960,018 A | 9/1999 | Jewell et al. | |
| 6,046,096 A | * 4/2000 | Ouchi | ........................ 438/510 |
| 6,330,263 B1 | * 12/2001 | Garbuzov et al. | ............. 372/45 |
| 6,566,688 B1 | * 5/2003 | Zhang et al. | .................. 257/85 |
| 2002/0075920 A1 | * 6/2002 | Spruytte et al. | .............. 372/45 |

FOREIGN PATENT DOCUMENTS

| | | |
|---|---|---|
| WO | WO 00/38287 | 6/2000 |
| WO | WO 01/33677 A2 | 5/2001 |

OTHER PUBLICATIONS

H. Simizu et al, 1.2 um range GaInAs SQW lasers using Sb as surfactant, Electronic Letters, vol. 36, No. 16 Aug. 3, 2000, p. 1379–1380.*

H. Shimizu et al., *1.2 um range GaInAs S QW lasers using Sb as surfactant*, Electronics Letters, vol. 36, No. 16, Aug. 3, 2000, 2 pages.

X. Yang et al., *Molecular beam epitaxial growth of InGaAsN:Sb/GaAs quantum wells for long–wavelength semiconductor lasers*, Applied Physics Letters, vol. 75, No. 2, Jul. 12, 1999, pp. 178–180.

X. Yang et al., *Photoluminescence of as–grown and thermally annealed InGaAsN/GaAs quantum wells grown by molecular beam epitaxy*, J. Vac. Sci. Technol., vol. B, No. 17(3), May/Jun. 1999, pp. 1144–1146.

X. Yang et al., *Low–Threshold 1.3–um InGaAsN:Sb–GaAs Single–Quantum–Well Lasers Grown by Molecular Beam Epitaxy*, IEEE Photonics Technology Letters, vol. 12, No. 2, Feb. 2000, pp. 128–130.

* cited by examiner

Primary Examiner—Minsun Harvey
Assistant Examiner—Armando Rodriguez
(74) Attorney, Agent, or Firm—Oblon, Spivak, McClelland, Maier & Neustadt, P.C.

(57) ABSTRACT

A semiconductor laser device includes a QW active layer structure including a $Ga_xIn_{1-x}As_{1-y}Sb_y$ layer wherein $0.3 \leq 1-x$ and $0.003 \leq y \leq 0.008$, or a QW active layer structure including a $Ga_xIn_{1-x}As_{1-y1-y2}N_{y1}Sb_{y2}$ layer wherein $0.3 \leq 1-x$, $0 < y1 < 0.03$ and $0.002 \leq y2 \leq 0.06$. The semiconductor laser device suppresses the three-dimensional epitaxial growth, and has superior optical characteristics including a low threshold current.

19 Claims, 13 Drawing Sheets

| | | |
|---|---|---|
| (1) | ● | In37% N=0.05ccm, GaAs barrier |
| (2) | ■ | In37% N=0.10ccm, GaAs barrier |
| (3) | ◆ | In37% N=0.15ccm, GaAs barrier |
| (4) | ▲ | In39% N=0.05ccm, GaAs barrier |
| (5) | ▼ | In39% N=0.10ccm, GaAs barrier |
| (6) | △ | In37% N=0.05ccm, GaNAs barrier |
| (7) | ○ | In37% N=0.10ccm, GaNAs barrier |
| (8) | □ | In37% N=0.15ccm, GaNAs barrier |
| (9) | ▽ | In39% N=0.05ccm, GaNAs barrier |

SEMICONDUCTOR LASER DEVICE HAVING LOWER THRESHOLD CURRENT

BACKGROUND OF THE INVENTION (a) Field of the Invention

The present invention relates to a semiconductor laser device having a lower threshold current.

(b) Description of the Related Art

Semiconductor laser devices operating at a wavelength band between 1.2 μm and 1.3 μm now attract larger attention for use as light sources in optical communication scriber lines.

Although a GaInAsP semiconductor laser device formed on an InP substrate is conventionally developed as a semiconductor laser device having an emission wavelength of 1.3 μm band, it has been a problem that the semiconductor materials used in the GaInAsP laser device has a poor characteristic temperature of the threshold current as low as 50K to 70K, which degrades the temperature characteristics of the laser device.

In order to dispose a semiconductor laser device in each of households as a light source, it is desired that the semiconductor laser module have a longer wavelength band and a superior temperature characteristic without using a cooling device, and also can be manufactured at a lower cost.

Thus, a variety of semiconductor laser devices having improved temperature characteristics and longer emission wavelengths have been developed. It is reported in "Jpn.J.Appl.Phys., vol.35(1996)", pp.1273–1275 by M. Kondow et al. that one of the semiconductor laser devices thus developed may have a temperature characteristic as high as about 180K. Also it is assured therein by an experiments that a prototype semiconductor laser device achieved a higher temperature characteristic around 130K to 270K.

Moreover, it is also reported by F. Koyama et al., in IEEE Photon. Technol. Lett., vol.12(2000) pp.125–127 that a characteristic temperature as high as around 140K–170K was realized by using a high-strained GaInAs semiconductor laser device operating at an emission wavelength band of 1.2 μm. It is to be noted that since the commercial single mode (SM) optical fiber has a cutoff for fundamental mode at 1.2 μm wavelength, the semiconductor laser device is expected for use as a light source in a local area network (LAN).

The conventional high-strained semiconductor laser device as described above suffers from the higher amount of strain and a poor mixing capability of the constituent element, nitrogen (N), into the V-group elements due to the fact that nitrogen has a smaller radius of atoms. This involves an undesirable three-dimensional growth and a large number of crystal defects unless the growth temperature is lowered to a minimum, which however degrades the optical quality for the crystal structure.

It is also noted that the high strained layer is difficult to grow with involving a longer-distance migration by using a molecular beam epitaxy (MBE) generally used for growing semiconductor layers.

SUMMARY OF THE INVENTION

In view of the above problem in the conventional semiconductor laser device, it is an object of the present invention to provide a GaInNAs semiconductor laser device and a high-strained GaInAs semiconductor laser device with an improved optical quality.

It is another object of the present invention to provide a method for manufacturing such a GaInNAs semiconductor device.

The present invention provides a semiconductor laser device including a GaAs substrate and a laser structure overlying thereon and including a quantum well (QW) active layer structure, said QW active layer structure including a $Ga_xIn_{1-x}As_{1-y}Sb_y$ well layer wherein $0.3 \leq 1-x$ and $0.003 \leq y \leq 0.008$ or a $Ga_xIn_{1-x}As_{1-y1-y2}N_{y1}Sb_{y2}$ well layer wherein $0.3 \leq 1-x$, $0 < y1 < 0.03$ and $0.002 \leq y2 \leq 0.06$.

In the semiconductor laser device of the present invention, it is preferable to suppress the migration of Group-III atoms to some extent because the Group-III atoms may grow in a three-dimensional structure due to agglomeration during growth of the same as a high-strained layer if the migration distance of the Group-III atoms is large.

The present invention also provides a method for manufacturing the semiconductor device including the step of heat treating the layer structure of the laser structure at temperatures depending on the composition of the active layer, after epitaxial growth of the $Ga_xIn_{1-x}As_{1-y1-y2}N_{y1}Sb_{y2}$ well layer. The heat treatment is conducted at a temperature of 570 degrees C. to 630 degrees C. when $0 < y1 < 0.007$ or at a temperature of 670 degrees C. to 730 degrees C. when $0.007 < y1 < 0.03$.

The above and other objects, features and advantages of the present invention will be more apparent from the following description, referring to the accompanying drawings.

PREFERRED EMBODIMENTS OF THE INVENTION

Before describing the preferred embodiments of the present invention, the principle of the present invention will be described for the sake of understanding.

Figure 1:
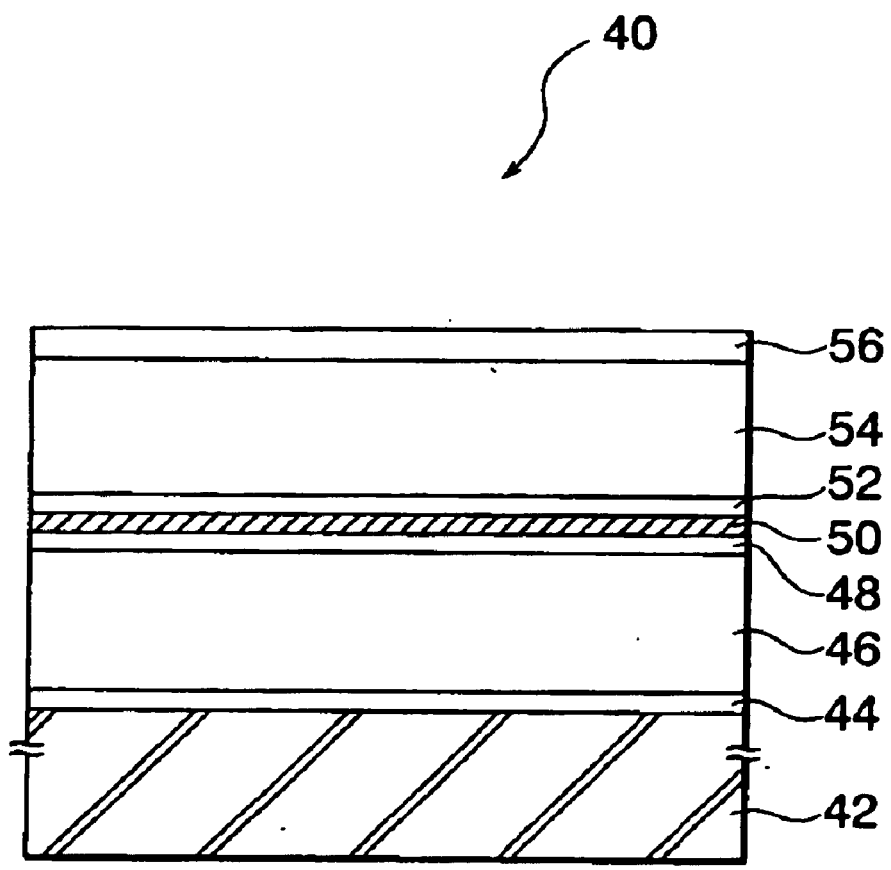
FIG. 1 is a sectional view of the epitaxial structure of a conventional high-strained GaInAs semiconductor laser device having an emission wavelength of 1.2 μm.

With reference to FIG. 1, a conventional high-strained $GaIn_{0.39}As$ semiconductor laser device operates at an emission wavelength of 1.2 μm. The semiconductor laser device 40 includes a multi-layer structure formed on a (100) plane of an n-GaAs substrate and including an n-type GaAs (n-GaAs) buffer layer 44 having a thickness of 0.2 μm, an n-InGaP cladding layer 46 having a thickness of 1.5 μm, a GaAs optical confinement layer 48 having a thickness of 0.13 μm, a GaInAs active layer 50, a GaAs optical confinement layer 52 having a thickness of 0.13 μm, a p-InGaP cladding layer 54 having a thickness of 1.5 μm, and a p-GaAs contact layer 56 having a thickness of 0.35 μm.

In the conventional semiconductor laser device of FIG. 1, an amount of compressive strain as high as 2.8% is generally needed for the active layer, which necessitates a smaller critical thickness around 4 nm for avoiding a three-dimensional growth. This makes it difficult to achieve an emission wavelength of 1.2 μm, or larger than 1.12 μm by using practical process conditions. In particular, it is difficult to use a molecular beam epitaxial (MBE) process having a larger migration length. The term, "high strain" as used herein means the degree of strain as high as or above 1.5%.

In a conventional GaInNAs semiconductor laser device, in order to realize a low threshold current in a wavelength band of 1.3 μm, nitrogen (N) is generally added to a GaInAs layer, wherein In is about 40% in the Group-III elements, at about 0.6% in atomic ratio relative to the V-group elements, to obtain a strain of around 2.7% in the total strain of the GaInNAs semiconductor laser. This device, however, suffers from the higher amount of strain and from poor mixing capability of the constituent element, nitrogen, into the V-group elements due to nitrogen having a smaller radius of atoms. This device thus involves a three-dimensional growth and a large number of crystal defects unless the epitaxial growth is conducted at a lower temperature, which degrades the optical quality for the crystal structure however.

In general, there are a plurality of techniques for epitaxially growing a semiconductor layer having a high strain, the techniques including (a) a lower-temperature growth, (b) a higher atomic ratio of V-group elements to Group-III elements, (c) a higher growth rate, and (d) using a surfactant.

The technique using the surfactant is such that elements having a property of higher segregation feasibility, such as Sb, Te and Sn, are used in a MBE or MOCVD for reducing the surface energy and the surface diffusion length of the group-III atoms to thereby suppress the three-dimensional growth. This technique is described by M. Copel et al., in Phys.Rev.Lett.vol.63(1989) pp.632–635.

In the ordinary growth technique using the surfactant, the growth step is stopped or interrupted to dispose the surfactant on the underlying layer in an amount of 1 ML or less before growing the high-strained layer. During the growth of the high-strained layer, the surfactant is not added, whereby the surfactant is floating on the surface of the high-strained layer without incorporating into the high-strained layer.

The present inventor noticed the effectiveness of addition of Sb in a minute amount of about 0.2% to 2.5% with respect to the amount of V-group elements together with addition of a Group-III element during the growth of the high strained layer, without disposing the surfactant on the underlying layer before growing the high-strained layer.

More specifically, a GaInAsSb layer is formed in a 1.2-μm band GaInAs semiconductor laser device, whereas a GaInNAsSb layer is formed in a 1.3-μm band GaInNAs semiconductor laser device. The experiments as detailed below and conducted by the inventor revealed the superiority of this technique to the conventional technique.

First Experiments

In the first experiments, Sb is added in a $GaIn_{0.39}As$ single quantum well (SQW) active layer, to thereby manufacture a 1.2-μm band semiconductor laser device.

Figure 4:
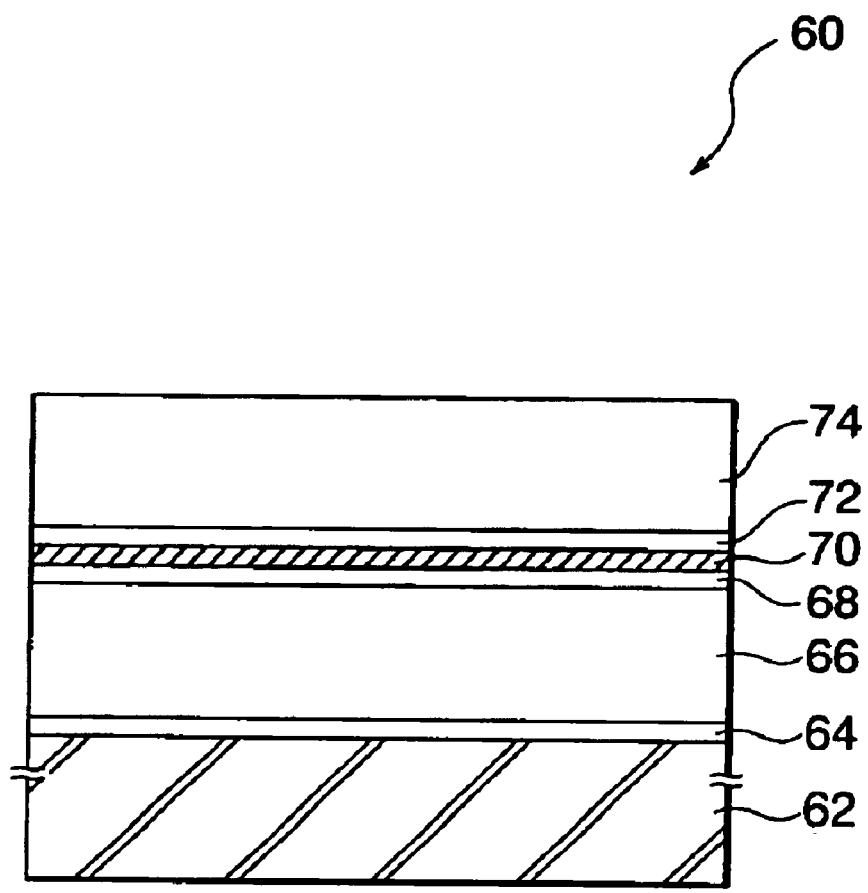
FIG. 4 is a sectional view of a test piece of a sample multi-layer structure.

The sample structure 60 shown in FIG. 4 used in the experiments included a 0.2-μm-thick n-GaAs buffer layer 64 (having an n-type impurity concentration of $2 \times 10^{17} cm^{-3}$, $n=2 \times 10^{17} cm^{-3}$), a 0.25 μm-thick $n-In_{0.484}Ga_{0.516}P$ cladding layer ($n=3 \times 10^{17} cm^{-3}$), a 0.13 -μm-thick GaAs optical confinement layer 68, a $GaIn_{0.39}AsSb/GaAs$ SQW active layer structure 70, a 0.13-μm-thick GaAs optical confinement layer 72, and a 0.25-μm-thick $p-In_{0.484}Ga_{0.516}P$ cladding layer 74 ($p=5 \times 10^{17} cm^{-3}$) were stacked consecutively on a (100) plane of a GaAs substrate 62 by using a MBE technique. The MBE technique may be replaced by a MOCVD technique.

A $GaIn_{0.039}As$ SQW layer has a higher compressive strain as high as 2.8%. The design thickness of the SQW layer structure is set at 7.3 nm, wherein the relationship between the critical thickness and the In content is calculated to obtain 4 nm for the critical thickness based on the theory presented by J. W. Matthews and A. E. Blakeslee for the GaInAs/GaAs semiconductor laser device.

Figure 5:
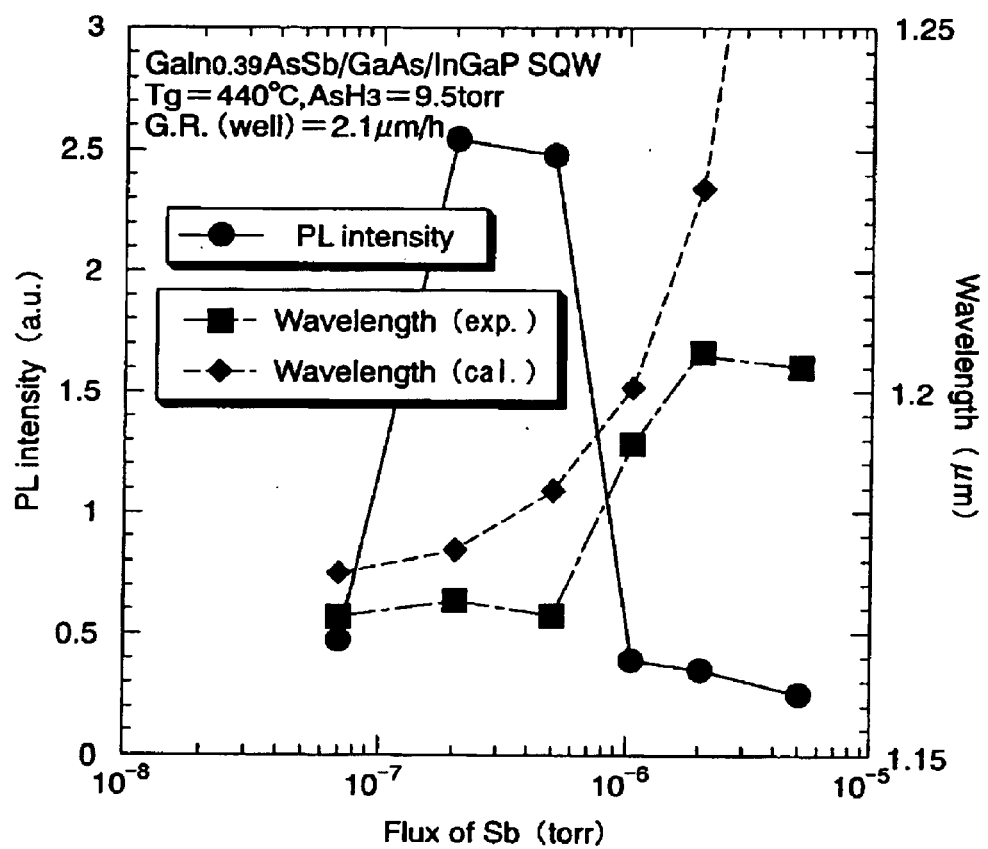
FIG. 5 is a graph showing test results for the dependency of the PL characteristics of a SQW structure on the amount of Sb flux, the SQW structure having GaInAsSb/GaAs/InGaP layers obtained by experiments.

In these experiments, Sb is added only to a $GaIn_{0.39}As$ SQW layer to form a GaInAsSb SQW layer. By changing the Sb flux (Torr) as a parameter, the photoluminescence (PL) dependency of the Sb flux was investigated. The results are shown in FIG. 5. The term "amount of Sb flux" or simply "Sb flux" as used herein means the intensity of the molecular beam of Sb incident onto the substrate and evaluated in terms of the partial pressure at the surface of the substrate.

The growth conditions of the GaInAsSb layer in the experiments are as follows:

Chamber pressure—$9.0 \times 10^{-5}$ Torr,
Growth temperature—440 degrees C.,
$AsH_3$ flux after cracking—$8.5 \times 10^{-5}$ Torr,
Growth rate of GaInAsSb SQW layer—2.1 μm/hour.

It is to be noted that $AsH_3$ and $PH_3$ are supplied after thermal decomposition or cracking at 1000 degrees C., before they reach the substrate.

Referring to FIG. 5, there is shown the dependencies of photoluminescence (PL) intensity and the PL wavelength on the Sb flux. It is understood from this drawing that Sb is effective in growth of a high strained GaInAs layer and that the highest PL intensity is obtained by addition of Sb at about $2 \times 10^{-7}$ Torr to $5 \times 10^{-7}$ Torr.

Second Experiments

Figure 6:
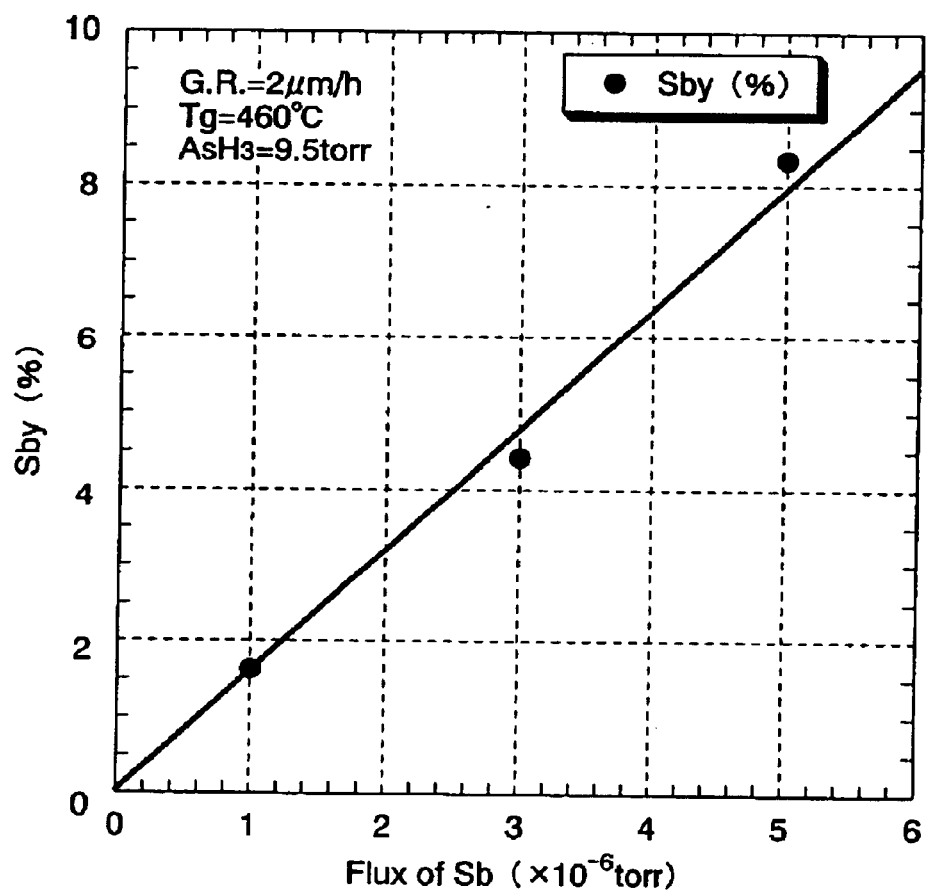
FIG. 6 is a graph showing the relationship obtained by experiments between the amount of Sb flux and the Sb composition of GaAsSb.

In order to investigate the amount of incorporation of Sb into a GaInAs well layer, GaAsSb layers were grown with different amounts of Sb flux, and the Sb contents (%) in the GaAsSb layers were measured. The results is shown in FIG. 6. The growth rate, the $AsH_3$ flux, and the growth temperature in the second experiments were identical to the epitaxial growth conditions of the GaInAsSb well layer of the first experiments.

Sb was incorporated into the GaAs film in a linear relation with respect to the Sb flux up to $5\times10^{-6}$ Torr, as shown in FIG. 6. Assuming that this Sb content is same as the Sb content in InGaAsSb, the quantum level of GaInAsSb is calculated. The results are shown in FIG. 5. It is also assumed that $Ec=0.7\Delta Eg$.

The PL wavelength indicated relatively good coincidence to the calculation up to a Sb flux of $2\times10^{-6}$ Torr.

At $2\times10^{-7}$ Torr where the PL intensity becomes the maximum, as understood from the first experiments, the composition of the GaInAsSb film resulted in $Ga_{0.61}In_{0.39}As_{0.9968}Sb_{0.0032}$, that means a minute amount of Sb was incorporated into the film. Thus, it is considered that Sb does not act as a surfactant, and that Sb is incorporated in the GaInAs film to act as a quasi-surfactant. Thus, it is considered that, in the area where the PL intensity is higher, a three-dimensional growth is suppressed and a two-dimensional growth is promoted. More specifically, it is considered that Sb has a function for lowering the surface energy, suppressing extension of the diffusion length, and suppressing the three-dimensional growth.

It is understood from FIG. 6 that, since the Sb content is 0.32% in terms of the atomic ratio relative to the V-group elements for the Sb flux of $2\times10^{-7}$ Torr, addition of Sb at a flux of $2\times10^{-7}$ Torr to $5\times10^{-7}$ Torr, or a Sb content of 0.3% to 0.8%, is optimum.

Third Experiments

Figure 7:
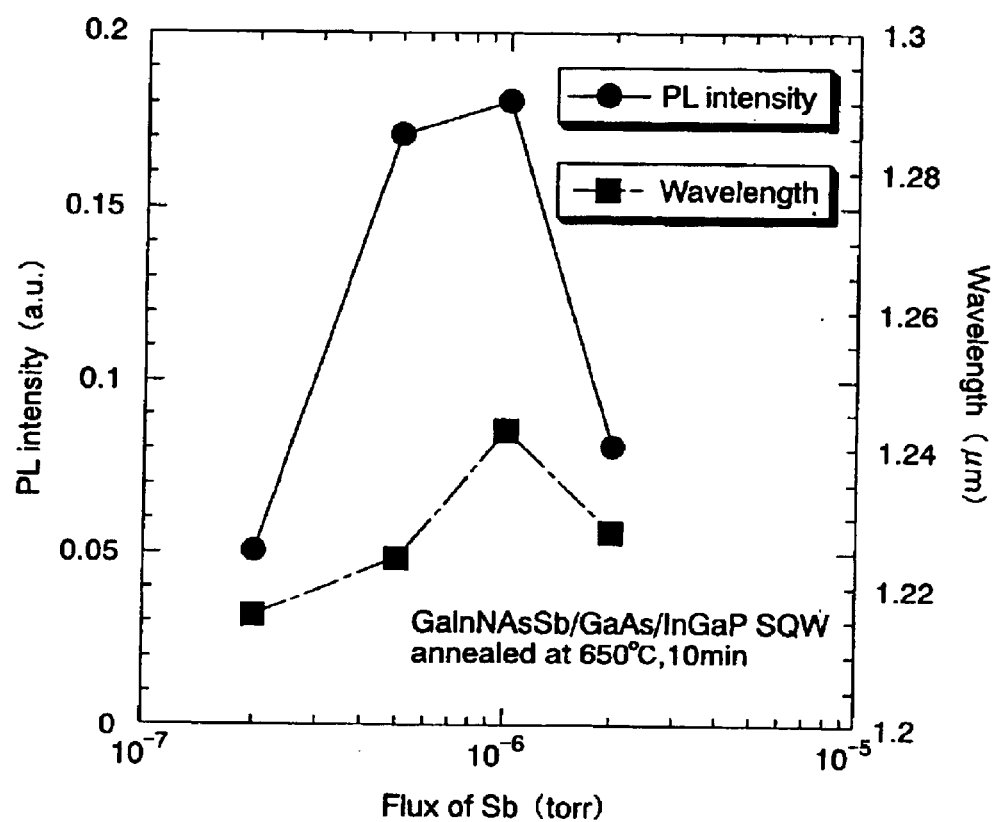
FIG. 7 is a graph showing the test results for the dependency of the PL characteristic of a SQW structure on the amount of Sb flux, the SQW structure having GaInAsNSb/GaAs/InGaP layers.

By changing the Sb flux (Torr) while fixing a specified condition, experiments for growing GaInNAsSb layers were conducted, and the results thus obtained are shown in FIG. 7. The structure for the third experiments is similar to the first experiments except that the SQW layer is implemented by $GaIn_{0.39}AsN_{0.0044}Sb$. The specified condition for growing the GaInAsNSb layer is as follows:

Chamber pressure—$9.5\times10^{-5}$ Torr;

Growth temperature—460 degrees C.;

$AsH_3$ flux after cracking—$8.5\times10^{-5}$ Torr;

Growth rate of GaInAsNSb well layer—2.1 $\mu$m/hour

The well layer had a compressive strain of 2.7% when the well layer had no Sb content (or made of $GaIn_{0.39}AsN_{0.0044}$), and had a design thickness of 7.3 nm. In addition, the nitrogen radicals excited by a RF plasma source were used as the nitrogen source. In order to recover the excellent crystallinity, after growth of a GaInNAsSb layer, a semi-insulating GaAs wafer is mounted on the GaInAsSb layer in a nitrogen ambient, in a face-to-face contact with the epitaxial layer side thereof, followed by an annealing step at a temperature of 650 degrees C. for ten minutes. The semi-insulating GaAs wafer functions as a cap layer for preventing the escape of phosphorus atoms.

FIG. 7 shows the Sb flux dependency of the PL intensity and the PL wavelength. It will be understood from FIG. 7 that a Sb flux of about $5\times10^{-7}$ to $1\times10^{-6}$ Torr is optimum for obtaining a higher PL intensity.

As described in connection with the second experiments for the growth of a GaAsSb layer, a Sb flux of $1\times10^{-6}$ Torr provides a Sb content of 1.6% relative to the V-group elements, and the nitrogen content is calculated at 0.44% relative to the V-group elements based on the wavelength shift of the as-grown epitaxial layer occurring with the addition of nitrogen.

From the second and third experiments, it was confirmed that the optical property of the GaInNAs layer is improved by the addition of Sb at an amount of 0.8 to 1.6% in terms of the Sb content.

In order to further investigate the property of GaInNAsSb SQW lasers, samples having a variety of Sb contents were observed by using a transmission electron microscope (TEM).

Figure 8A:
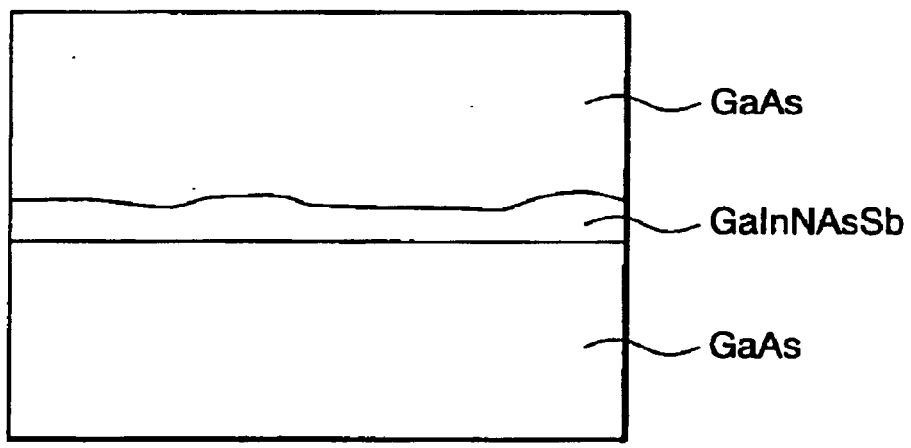
FIGS. 8A and 8B illustrate cross-sectional views of GaInAsSb layers grown with the amounts of Sb flux of $2 \times 10^{-7}$ Torr and $1 \times 10^{-6}$ Torr, respectively.
Figure 8B:
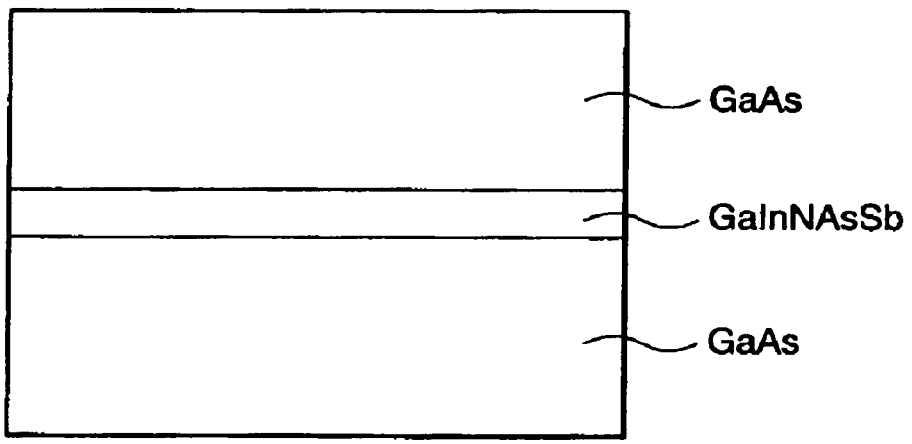

FIGS. 8A and 8B respectively show the TEM image photography of GaInNAsSb layers grown with the addition of Sb at amounts of Sb flux of $2\times10^{-7}$ Torr and $1\times10^{-6}$ Torr, respectively.

The SQW layer grown in a Sb flux of $2\times10^{-7}$ Torr, as shown in FIG. 8A, had a three-dimensional structure and the SQW layer grown in a Sb flux of $1\times10^{-6}$ Torr, as shown in FIG. 8B, had an excellent two-dimensional structure. By comparison between FIGS. 8A and 8B, it is understood that the critical thickness between the two-dimensional structure and the three-dimensional structure can be improved by the Sb content due to the Sb acting as a quasi-surfactant in a GaInNAs/GaAs based semiconductor laser.

In addition, in order to increase the laser emission wavelength up to 1.3 $\mu$m, the nitrogen content should be increased to some extent, which necessitates increase of the Sb content. Although the optimum Sb content depends on the composition of the layer, a larger N content generally increases the optimum Sb content.

In the third experiments, although the PL wavelength after the heat treatment is 1.24 $\mu$m for a nitrogen content of 0.44% and a Sb flux of $1\times10^{-6}$ Torr, the emission wavelength is desirable to be increased up to 1.35 $\mu$m in consideration that WDM (wavelength division multiplexing) system is expected to develop into a 1.3 $\mu$m band wavelength. In such a case, the nitrogen content should be increased up to around 1.5% depending on the In content.

The upper limit (UL) of Sb content is calculated from the maximum value (Mx=1.6%) of the optimum Sb content in the third experiments, the nitrogen content (Nc1=1.5%) necessary for achieving the 1.35 $\mu$m wavelength and the nitrogen content (Nc2=0.44%) obtained in the third experiments, as follows:

$$UL=Mx\times Nc1/Nc2=1.6\%\times1.5\%/0.44\%\approx6\%.$$

The lower limit (LL) of Sb content is calculated from the minimum value (Min=0.8%) of the optimum Sb content in the third experiments, the minimum nitrogen content (Nc3=0.1%) for achieving the 1.3 $\mu$m band wavelength by increasing the In content and the nitrogen content (Nc2=0.44%) obtained in the third experiments, as follows $$LL=Min\times Nc3/Nc2=0.8\%\times0.1\%/0.44\%\approx0.2\%.$$

In short, the Sb content for allowing the semiconductor laser device to cover the 1.3 $\mu$m range should be between 0.2% and 6%.

Fourth Experiments

The fourth experiments are such that the wavelength is increased up to 1.3 $\mu$m by using a GaInNAsSb well layer. We observed that the use of both GaInNAsSb well layer and GaAs barrier layer involved a problem in that the PL intensity in the vicinity of 1.3 $\mu$m decreases down to $\frac{1}{20}$ compared to the PL intensity in the vicinity of 1.2 $\mu$m, as shown by the graphs (1) to (5) in FIG. 9.

Figure 9:
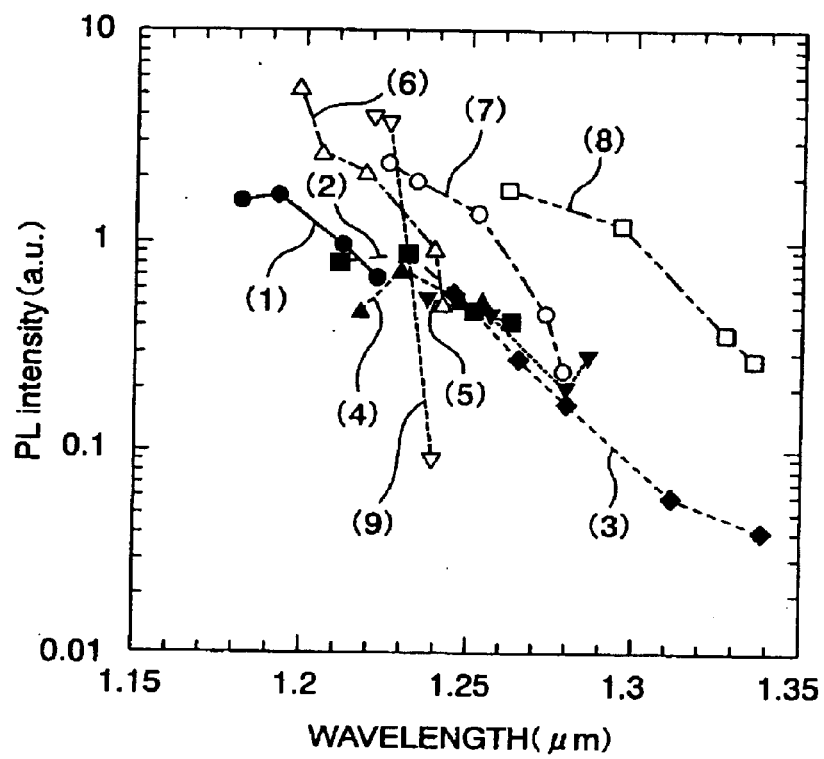
FIG. 9 is the wavelength dependency of the PL characteristic, with the PL wavelength plotted on the abscissa and the PL intensity plotted on the ordinate.

FIG. 9 shows the results of the present experiments wherein the well layers were formed for a variety of In contents and nitrogen contents for the GaInNAsSb layer. The results exhibited the tendency of reduction in the PL intensity along a specific curve for the different contents in the well layer so long as GaAs is used as the barrier layers.

For preparing the graphs (1) to (5), a plurality of laser structures were formed each including an n-GaAs buffer layer having a thickness of 0.2 μm, an n-In$_{0.47}$Ga$_{0.53}$P cladding layer having a thickness of 0.25 μm, a GaAs optical confinement layer having a thickness of 0.1 μm, a SQW active layer structure including a GaAs barrier layer having a thickness of 0.03 μm, a SQW layer having a thickness of 7.3 nm, and a GaAs barrier layer having a thickness of 0.03 sum, a GaAs optical confinement layer having a thickness of 0.1 μm, and a p-In$_{0.47}$Ga$_{0.53}$P cladding layer having thickness of 0.25 μm, which were consecutively formed in this order on a (100) plane of an n-GaAs substrate. The SQW layer is made of Ga$_x$In$_{1-x}$N$_{1-y-0.016}$As$_y$Sb$_{0.016}$.

Some samples of the laser structures were formed at a growth temperature of 460 degrees C. for the well layers and the barrier layers, with the In content in the GaInNAsSb well layer being 37%, the nitrogen flow rate being varied at 0.05 sccm, 0.10 sccm and 0.15 sccm. The other samples of the laser structures were also formed with the In content in the GaInNAsSb well layer being 39%, and the nitrogen flow rate at 0.05 sccm and 0.10 sccm, with the other conditions being maintained similar to the some samples. These samples of the laser structures were subjected to a heat treatment at a temperature of 500 to 700 degrees C. in a nitrogen ambient for ten minutes for improvement of the crystallinity after the epitaxial growth.

The resultant laser structures having those well layers and barrier layers are subjected to measurements of the PL wavelength and the PL intensity thereof. The results of the measurements are by the graphs (1) to (5) shown in FIG. 9, with the PL wavelength and the PL intensity (%) being plotted on abscissa and ordinate, respectively, for showing the PL wavelength dependency of the PL intensity. The PL intensity is plotted on arbitrary unit for showing the relative intensity between the samples.

Tables 1 to 5 show the measured values plotted on the graphs (1) to (5), respectively.

TABLE 1

| temperature of heat treatment degrees C. | wavelength μm | PL intensity (a.u.) |
|---|---|---|
| 500 | 1.223 | 0.69 |
| 550 | 1.212 | 0.99 |
| 600 | 1.192 | 1.7 |
| 650 | 1.181 | 1.58 |
| 700 | | | for GaAs barrier layers, In content of 37% and nitrogen flow rate of 0.05 sccm.

TABLE 2

| temperature of heat treatment degrees C. | wavelength μm | PL intensity (a.u.) |
|---|---|---|
| 500 | 1.263 | 0.43 |
| 550 | 1.252 | 0.47 |
| 600 | 1.232 | 0.9 |
| 650 | 1.211 | 0.81 |
| 700 | | | for GaAs barrier layers, In content of 37% and nitrogen flow rate of 0.10 sccm.

TABLE 3

| temperature of heat treatment degrees C. | wavelength μm | PL intensity (a.u.) |
|---|---|---|
| 500 | 1.338 | 0.04 |
| 550 | 1.312 | 0.06 |
| 600 | 1.280 | 0.17 |
| 650 | 1.266 | 0.28 |
| 700 | 1.248 | 0.56 | for GaAs barrier layers, In content of 37% and nitrogen flow rate of 0.15 sccm.

TABLE 4

| temperature of heat treatment degrees C. | wavelength μm | PL intensity (a.u.) |
|---|---|---|
| 500 | 1.255 | 0.54 |
| 550 | 1.249 | 0.54 |
| 600 | 1.230 | 0.74 |
| 650 | 1.218 | 0.49 |
| 700 | | | for GaAs barrier layers, In content of 39% and nitrogen flow rate of 0.05 sccm.

TABLE 5

| temperature of heat treatment degrees C. | wavelength μm | PL intensity (a.u.) |
|---|---|---|
| 500 | 1.286 | 0.28 |
| 550 | 1.281 | 0.20 |
| 600 | 1.257 | 0.44 |
| 650 | 1.238 | 0.54 |
| 700 | | | for GaAs barrier layers, In content of 39% and nitrogen flow rate of 0.10 sccm.

By performing a high-temperature heat treatment to an epitaxial layer, photoluminescence (PL) intensity increases by several times compared to the as-grown epitaxial layer without the high-temperature heat treatment, with an effect of decrease of the GaInNAs(Sb) layer, however, in the bandgap wavelength.

For example, the relationship between the PL wavelength and the PL intensity for the case of an In content of 37% and a nitrogen flow rate of 0.05 sccm is such that shown by the graph (1) wherein the wavelength of the as-grown layer is 1.222 μm whereas the wavelengths of the epitaxial layers subjected to the heat treatments at 550 degrees C. and 650 degrees C. are 1.21 μm and 1.18 μm, respectively.

As understood from FIG. 9, the PL intensity of the laser structure having GaAs barrier layers and a PL wavelength of 1.3 μm is remarkably lower compared to a GaInNAsSb well layer having a PL wavelength of 1.2 μm regardless of the composition of the well layer. Especially, in the case of an In content of 37% in the well layer and a nitrogen flow rate of 0.15 sccm, the PL intensity is lower by ½₀, as shown in the graph (3). The lower PL intensity results from the degradation in the crystallinity of the epitaxial layers.

Thus, the inventor examined the solution of the lower PL intensity by using a GaNAs barrier layers having the structure as will be detailed below.

An n-GaAs buffer layer having a thickness of 0.2 μm, an n-In$_{0.47}$Ga$_{0.53}$P cladding layer having a thickness of 0.25 μm, a GaAs optical confinement layer having a thickness 0.1 μm a GaNAs barrier layer having a thickness of 0.03 μm, a SQW layer having a thickness of 7.3 nm, a GaNAs barrier layer having a thickness of 0.03 µm, a GaAs optical confinement layer having a thickness of 0.1 µm and a p-InGaP cladding layer having thickness of 0.25 µm were consecutively grown on a (100) plane of an n-GaAs substrate to form a layer structure implementing a laser structure. A plurality of laser structures having the layer structure described above were formed.

The SQW layer is made of $Ga_xIn_{1-x}N_{1-y-0.016}As_ySb_{0.016}$ similarly to the laser structure having GaAs barrier layers. While changing the In content in the SQW layers, the nitrogen content is changed in accordance therewith between 0.66% and 1.8%, or between 0.05 sccm and 0.15 sccm in terms of the nitrogen flow rate, in the GaNAs barrier layer.

Some laser structures were formed with the In content in the GaInNAsSb well layer being fixed at 37%, with the nitrogen content being changed from 0.33% to 1.8% (or the nitrogen ($N_2$) flow rate between 0.05 sccm and 0.15 sccm), and other laser structures were formed with the In content being fixed at 39% and with the nitrogen flow rate being fixed at 0.05 sccm. The layers of these laser structures were subjected to a heat treatment, and the PL intensity and the PL wavelength were measured before and after the heat treatment. The results of the measurements are shown by graphs (6) to (9) in FIG. 9.

The values obtained by the measurements are shown in Tables 6 to 9.

TABLE 6

| temperature of heat treatment degrees C. | wavelength µm | PL intensity (a.u.) |
|---|---|---|
| 500 | 1.243 | 0.52 |
| 550 | 1.240 | 0.96 |
| 600 | 1.219 | 2.2 |
| 650 | 1.206 | 2.7 |
| 700 | 1.198 | 5.5 | for GaNAs barrier layers, In content of 37% and nitrogen flow rate of 0.05 sccm.

TABLE 7

| temperature of heat treatment degrees C. | wavelength µm | PL intensity (a.u.) |
|---|---|---|
| 500 | 1.279 | 0.24 |
| 550 | 1.274 | 0.45 |
| 600 | 1.253 | 1.4 |
| 650 | 1.234 | 2.0 |
| 700 | 1.226 | 2.4 | for GaNAs barrier layers, In content of 37% and nitrogen flow rate of 0.10 sccm.

TABLE 8

| temperature of heat treatment degrees C. | wavelength µm | PL intensity (a.u.) |
|---|---|---|
| 500 | 1.348 | 0.03 |
| 550 | 1.336 | 0.29 |
| 600 | 1.328 | 0.38 |
| 650 | 1.296 | 1.23 |
| 700 | 1.262 | 1.83 |

TABLE 8-continued

| temperature of heat treatment degrees C. | wavelength µm | PL intensity (a.u.) |
|---|---|---| for GaNAs barrier layers, In content of 37% and nitrogen flow rate of 0.15 sccm.

TABLE 9

| temperature of heat treatment degrees C. | wavelength µm | PL intensity (a.u.) |
|---|---|---|
| 500 | | |
| 550 | 1.240 | 0.09 |
| 600 | 1.226 | 3.7 |
| 650 | 1.221 | 3.9 |
| 700 | | | for GaNAs barrier layers, In content of 39% and nitrogen flow rate of 0.05 sccm.

Although the PL intensity of the as-grown epitaxial layers including a pair of GaNAs barrier layers is lower, the PL intensity increases sharply after the heat treatment at 650 degrees C. or above.

For example, a heat treatment at 650 degrees C. after the growth of a SQW structure including a $Ga_{0.63}In_{0.37}N_{0.009}As_{0.975}Sb_{0.016}$ well layer and a pair of $GaN_{0.018}As_{0.982}$ barrier layers achieved a PL wavelength of 1.30 µm and a PL intensity which is comparable to the PL intensity of the SQW structure including GaAs barrier layers and having an emission wavelength around 1.20 µm, as shown by the graph (8) in FIG. 9. The graph (8) shows the data in the active layer structure having the described compositions after heat treatments at 550 degrees C., 600 degrees C., 650 degrees C. and 700 degrees C. consecutively from the right.

It is to be noted that the growth of the SQW active layer structure including $Ga_{0.63}In_{0.37}N_{0.009}As_{0.975}Sb_{0.016}$ well layer and a pair of $GaN_{0.018}As_{0.982}$ barrier layers and the subsequent heat treatment of the as-grown epitaxial structure at 650 degrees C. achieved a PL wavelength of 1.30 µm and a PL intensity similar to the PL intensity of the laser structure having GaAs barrier lasers and emitting at a wavelength in the vicinity of 1.20 µm.

The reason for the increase in the PL intensity due to the GaInNAsSb layer is considered to result from the fact that the presence of nitrogen both in the barrier layers and in the well layer achieves a quasi-homogeneous epitaxial growth to thereby improve the crystallinity of these layers.

Thus, a laser structure including SQW active layer structure having $Ga_{0.63}In_{0.37}N_{0.009}As_{0.975}Sb_{0.016}$/$GaN_{0.018}As_{0.982}$ layers was fabricated as a broad contact laser, which exhibited a excellent lower threshold current as low as 570 A/cm$^2$ for a cavity length of 900 µm.

Figure 10:
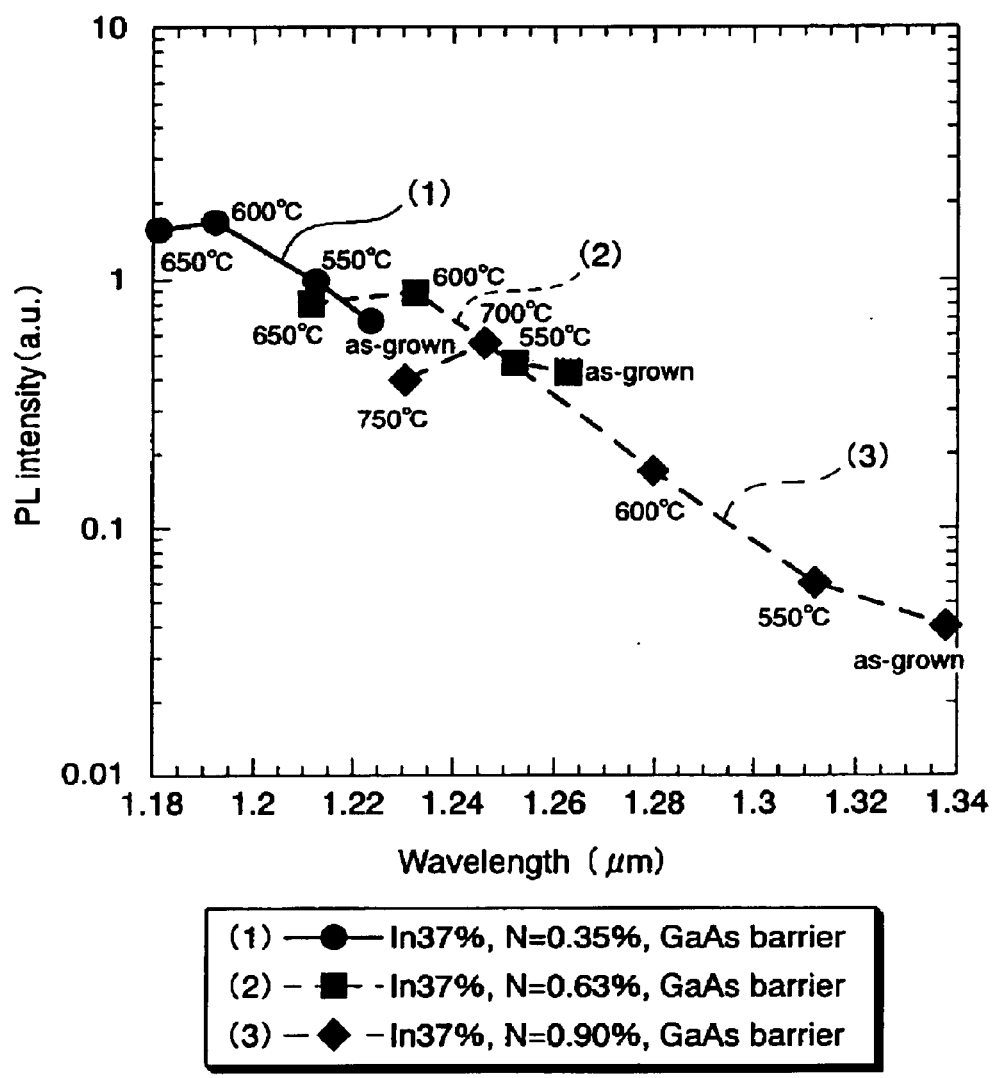
FIG. 10 is the wavelength dependency and the temperature dependency of the PL intensity in the case of GaAs barrier layers, with the temperature of the heat treatment as a parameter, the PL wavelength (μm) plotted on the abscissa and the and the PL intensity plotted on the ordinate.
Figure 11:
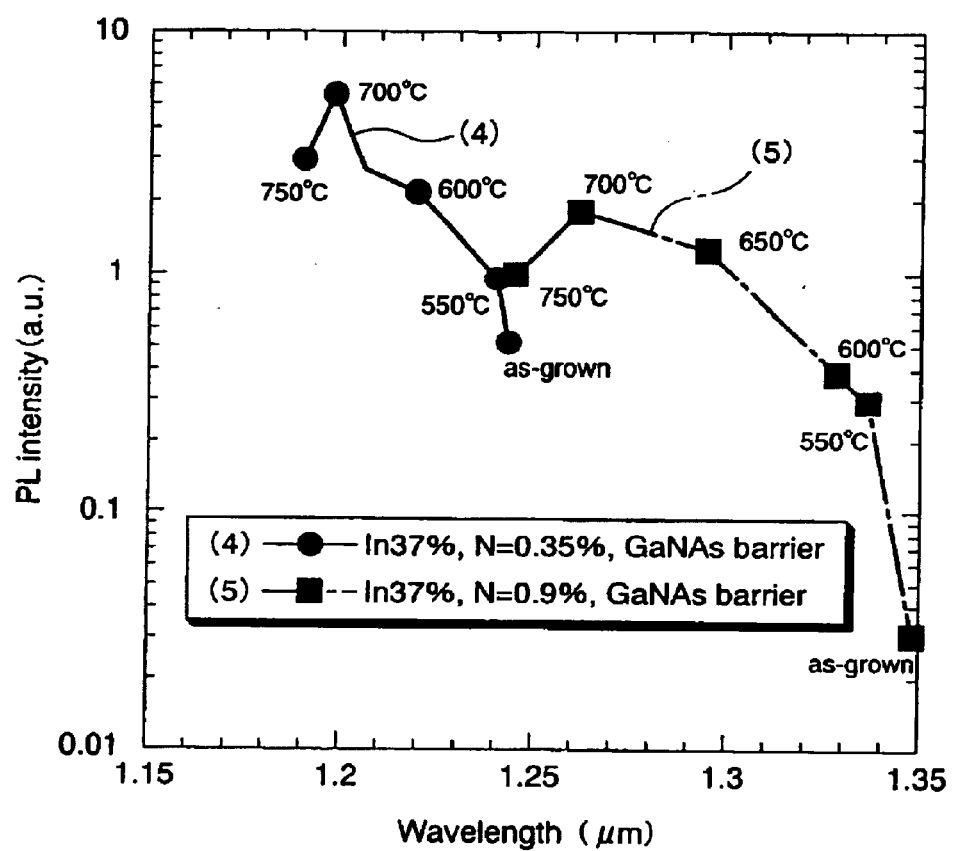
FIG. 11 is a graph showing the wavelength dependency and the temperature dependency of the PL intensity in the case of GaNAs barrier layers, with the temperature of the heat treatment as a parameter, the PL wavelength (μm) plotted on the abscissa and the and the PL intensity plotted on the ordinate.

By arranging the data shown in FIG. 9 and Tables 1 to 9, the relationship between the PL wavelength and the PL intensity was investigated in the combination of a $Ga_xIn_{1-x}As_{1-y1-y2}N_{y1}Sb_{y2}$ well layer and a pair of GaAs barrier layers for an In content of 37% and the nitrogen contents of 0.35%, 0.63% and 0.90%, with the heat treatment temperature being a parameter. The results are shown in FIG. 10. The relationship between the PL wavelength and the PL intensity was investigated in the combination of $Ga_xIn_{1-x}As_{1-y1-y2}N_{y1}Sb_{y2}$ well layer and a pair of GaNAs barrier layers for an In content of 37% and the nitrogen contents of 0.35% and 0.90%, with the heat treatment temperature being a parameter. The results are shown in FIG. 11.

From FIGS. 10 and 11, it is understood that a suitable heat treatment temperature resides in the following ranges:

(1) 600±25 degrees C. for a nitrogen content below 0.7% in the well layer in the case of GaAs barrier layers;
(2) 700±25 degrees C. for a nitrogen content of 0.7% to 3% in the well layer in the case of GaAs barrier layers; and
(3) 700±125 degrees C. irrespective of the nitrogen content in the well layer in the case of GaNAs barrier layers, if the well layer is implemented by a $Ga_xIn_{1-x}As_{1-y1-y2}N_{y1}Sb_{y2}$ layer.

From the above experiments and investigation of the results in the experiments, the optical properties of the GaInAs semiconductor laser devices having an emission wavelength of 1.2 μm band, wherein In is included at an atomic ratio of 30% or more relative to Group-III elements can be improved remarkably by adding Sb as a constituent element at an atomic ratio of 0.3% to 0.8% relative V-group elements during the epitaxial growth of the GaInAs layer. In the case of GaInNAs semiconductor laser devices, Sb is added at an atomic ratio of 0.2% to 2.5% relative to the V-group elements during the epitaxial growth of the GaIn-NAs layer.

In the above configuration, a higher nitrogen content may degrade the crystallinity of the semiconductor laser, and thus the practical upper limit of the nitrogen content is preferably below 3% relative to V-group elements.

As described before with reference to FIG. 9, GaNAs barrier layers assist for lasing with a lower threshold current at an emission wavelength of 1.3 μm. In such a case, the GaNAs layer should be made of $GaN_yAs_{1-y}$ (y<0.05).

Now, the present invention is more specifically described with reference to accompanying drawings, wherein similar constituent elements are designated by similar reference numerals.

First Embodiment

Figure 2:
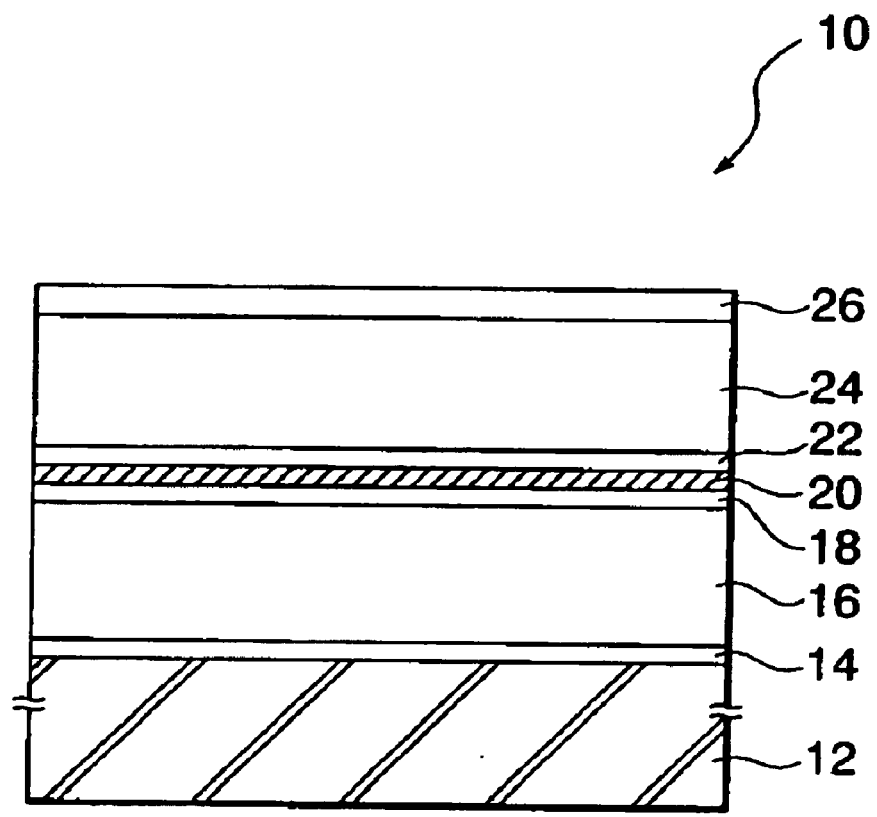
FIG. 2 is a sectional view of the epitaxial structure of a semiconductor laser device according to a first embodiment of the present invention.

Referring to FIG. 2, a semiconductor laser device according to a first embodiment of the present invention is implemented as a 1.2-μm band GaInAsSb semiconductor laser device of a facet emission type. The semiconductor laser device generally designated at numeral 10 includes an n-GaAs substrate 12 having a thickness of 100 μm and a main surface directed to (100) plane, a 0.5-μm-thick n-GaAs buffer layer 14 having an n-type impurity concentration of $1×10^{18}cm^{-3}$ (or $n=1×10^{18}cm^{-3}$), a 1.5-μm-thick n-$In_{0.49}Ga_{0.51}P$ cladding layer ($n=1×10^{18}cm^{-3}$) 16, a 0.1-μm-thick GaAs optical confinement layer 18, a SQW active layer structure 20 including a GaInAsSb SQW layer, a 0.1-μm-thick GaAs optical confinement layer 22, a 1.5-μm-thick p-$In_{0.49}Ga_{0.51}P$ cladding layer 24 ($p=1×10^{18}cm^{-3}$), and a 0.3-μm-thick p-GaAs contact layer 26 ($p=3×10^{19}cm^{-3}$), which are consecutively formed on the (100) plane of the GaAs substrate 12.

The SQW active layer structure 20 includes a single well layer made of $Ga_{0.61}In_{0.39}As_{0.9968}Sb_{0.0032}$ having a compressive strain of 2.82%, and the thickness of the well layer is 7.3 nm.

The GaInAsSb well layer is grown under the following conditions in case of gas-source MBE growth:

Chamber pressure—$9.0×10^{-5}$ Torr;

Growth temperature—460 degrees C.;

$AsH_3$ flux after cracking—$8.5×10^{-5}$ Torr;

Growth rate of GaInAsSb—2.1 μm/hour; and

Sb flux—$2.0×10^{-7}$ Torr.

The above layers are grown by either a gas-source MBE technique, MBE technique, CBE technique, or MOCVD technique.

Although not explicitly illustrated, the semiconductor laser device of the present embodiment is formed as a ridge waveguide semiconductor laser device by mesa-etching of the above layers to have an active layer width of 3 μm.

The semiconductor laser device also includes a p-side ohmix electrode made of metallic layers including Au—Zn or Ti/Pt/Au films on the contact layer 26, and an n-side ohmic electrode made of metallic layers including Au—Ge/Ni/Au films.

The semiconductor laser device has a cavity length of 200 μm, and includes a high reflective (HR)-coat having a reflectance of 78% at the front facet and a HR-coat having a reflectance of 95% at the rear facet.

A sample of the semiconductor laser device of the present embodiment was fabricated and subjected to measurements for characteristics of the optical output with respect to injected current after the bonding thereof. The results of the measurements were such that the threshold current at 20 degrees C. was 6 mA, the characteristic temperature of the threshold current between 20 and 70 degrees C. was 256K, and CW emission wavelength was 1.20 μm at a room temperature. In short, the sample had a threshold current which is lowest among the high-strained GaInAs semiconductor laser devices reported heretofore and a characteristic temperature which is significantly higher than those of the conventional ones.

Second Embodiment

Figure 3:
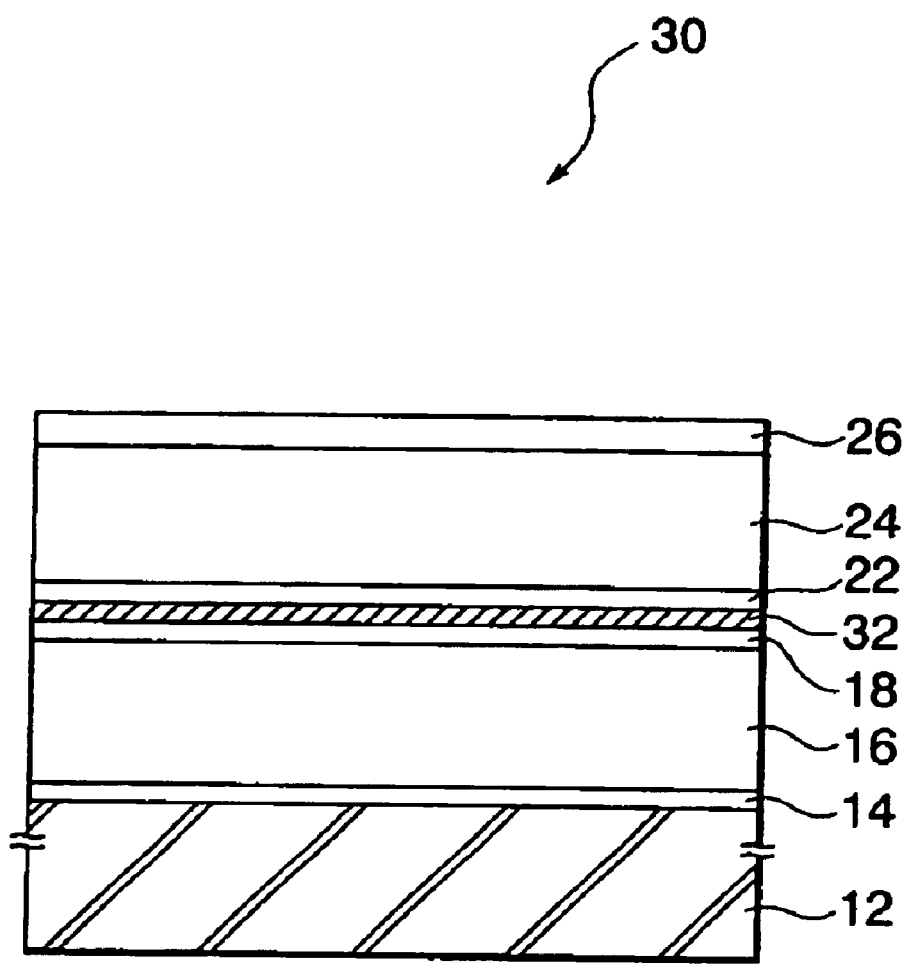
FIG. 3 is a a sectional view of the epitaxial structure of a semiconductor laser device according to a second embodiment of the present invention.

Referring to FIG. 3, a semiconductor laser device according to a second embodiment of the present invention is implemented as a GaInAsN semiconductor laser device having an emission wavelength of 1.25 to 1.3 μm band. The semiconductor laser device 30 of the present embodiment is similar to the first embodiment except that a SQW active layer structure 32 including a single GaInAsNSb well layer is used in the present embodiment instead of the GaInAsSb SQW active layer structure 20 in the first embodiment.

The SQW active layer structure 32 includes a single $Ga_{0.61}In_{0.39}As_{0.9796}N_{0.0044}Sb_{0.016}$ well layer having a thickness of 7.3 nm.

The GaInNAsSb well layer is grown under the following conditions:

Chamber pressure—$9.0×10^{-5}$ Torr;

Growth temperature—460 degrees C.;

$AsH_3$ flux after cracking—$8.5×10^{-5}$ Torr;

Growth rate of GaInNAsSb—2.1 μm/hour; and $N_2$ flux—$2.0×10^{-6}$ Torr.

The layer structure epitaxially grown was subject to a heat treatment at a temperature of 600 degrees C.

A sample of the semiconductor laser device of the present embodiment was fabricated and subjected to measurements for characteristics of the optical output with respect to injected current after the bonding thereof. The results of the measurements were such that the threshold current at 20 degrees C. was 10 mA, the characteristic temperature of the threshold current between 20 and 85 degrees C. was 157K, and the CW emission wavelength was 1.26 μm at a room temperature. In short, the sample had a threshold current which is the lowest among the high-strained GaInNAs semiconductor laser devices reported heretofore and a characteristic temperature which is significantly higher than those of the conventional ones.

Although the sample had a CW emission wavelength of 1.26 μm, a variation of the configuration of the second embodiment provides a semiconductor laser device having an emission wavelength of 1.3 μm by adjusting the nitrogen content and the Sb content and by additionally using barrier layers each having a composition of GaN$_y$As$_{1-y}$ (N<0.05). The semiconductor laser device of the present invention may be a MQW laser device instead of the SQW laser devices as used in the first and second embodiments. The In content may be preferably in the range between 15% and 45% although the In content in the embodiments was exemplified at 39%.

The GaAs or GaNAs barrier layers as used in the first or second embodiment may be GaInNAs(Sb) or GaInAsP layers, each of which may have a strain.

The GaAs optical confinement layer having a SCH (Separate Confinement Heterostructure) configuration as used in the embodiments may be replaced by an Al$_x$Ga$_{1-x}$As layer having a GRIN (Graded Refractive Index)-SCH configuration. In addition, the cladding layer may be made of AlGaAs.

Third Embodiment

Figure 12:
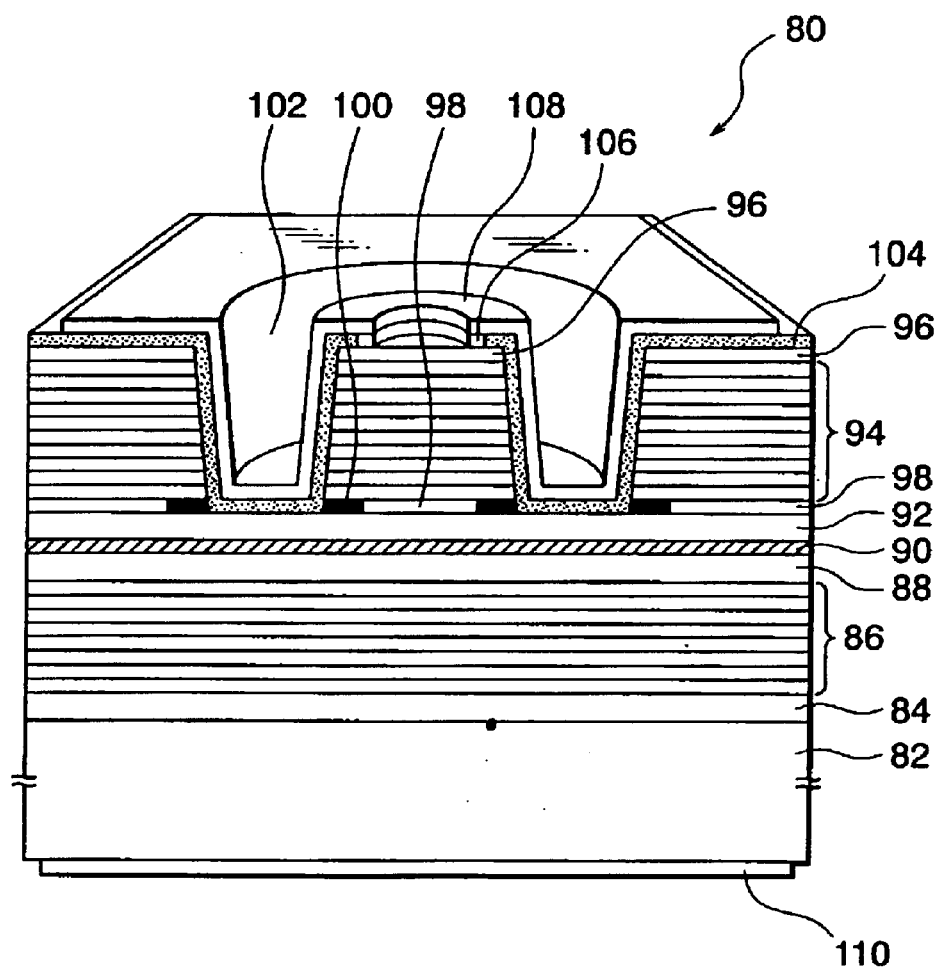
FIG. 12 is a perspective view of a vertical cavity surface emitting laser (VCSEL) according to a third embodiment of the present invention.
Figure 13:
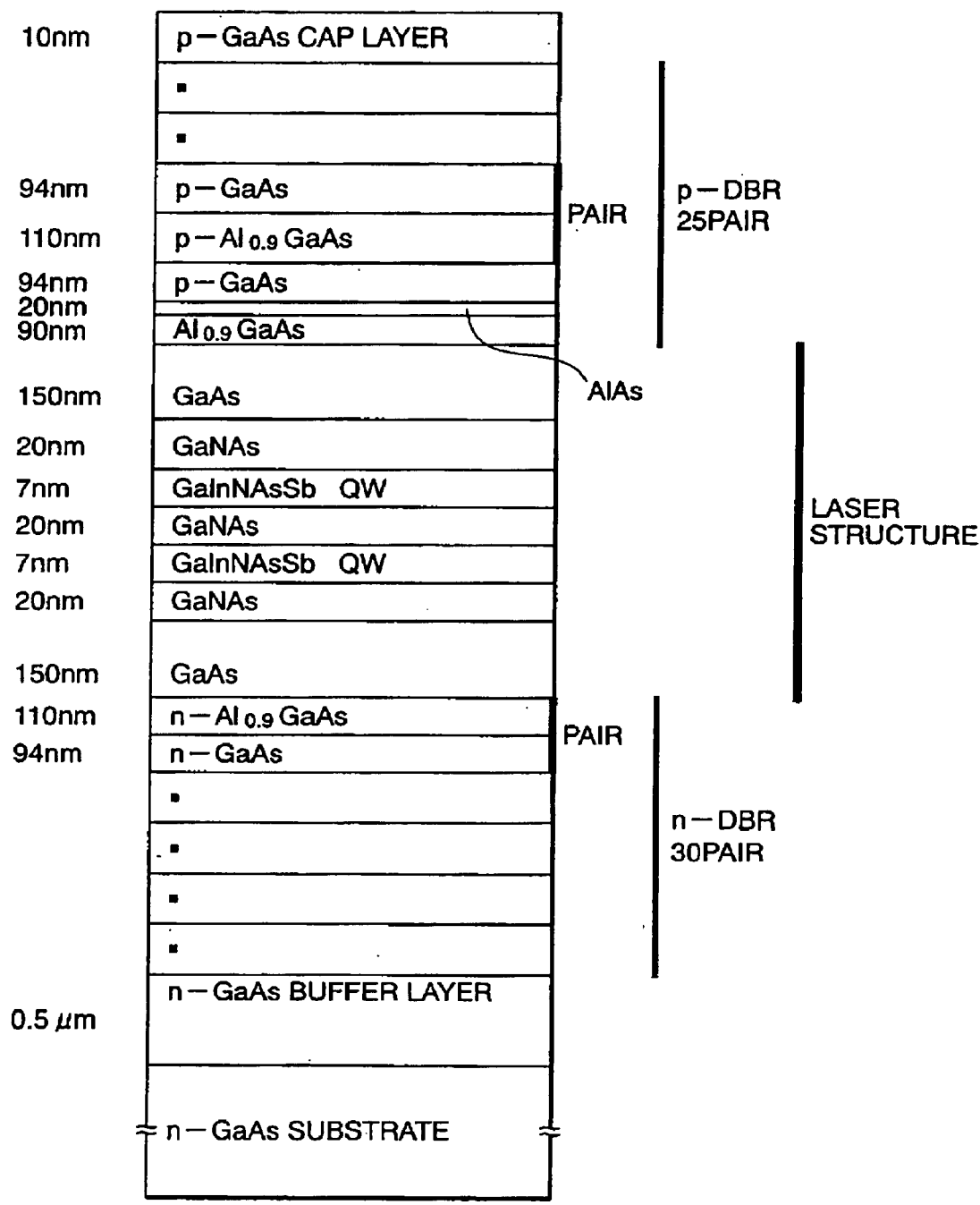
FIG. 13 is a schematic sectional view showing the layer structure of VCSELs of FIG. 12.

Referring to FIG. 12, a semiconductor laser device according to a third embodiment of the present invention is implemented as a 1.3-μm band VCSELs device having a GaInNAsSb/GaNAs active layer structure. The detail of the layer structure of the VCSELs device, including typical dimensions, is shown in FIG. 13.

The semiconductor laser device 80 of the present embodiment includes an n-GaAs substrate 82 having a (100) plane, and a layer structure formed thereon, the layer structure including a 0.5-μm-thick n-GaAs buffer layer (n=1×10$^{18}$ cm$^{-3}$) 84, a bottom DBR (Distributed Bragg Reflector) mirror 86 including 30 pairs of layers each including an n-GaAs/n-Al$_{0.9}$Ga$_{0.1}$As pair, a 150-nm-thick undoped GaAs lower cladding layer 88, a quantum well active layer structure 90, a 150-nm-thick undoped GaAs upper cladding layer 92, a top DBR mirror 94 having 25 pairs of layers each including a p-Al$_{0.9}$Ga$_{0.1}$As/p-GaAs pair, and a 10-nm-thick p-GaAs cap layer 96.

Each layer of the pair of layers in both the bottom DBR mirror and the top DBR mirror has a thickness corresponding to λ/4n, given λ and n being the emission wavelength of the laser device and the refractive index of the each layer, respectively.

More specifically, the pair of layers in the bottom DBR mirror includes a 94-nm-thick n-GaAs layer and a 110-nm-thick n-Al$_{0.9}$Ga$_{0.1}$As layer. The pair of layers in the top DBR mirror includes a 94-nm-thick p-GaAs layer and a 10-nm-thick p-Al$_{0.9}$Ga$_{0.1}$As layer.

The SQW active layer structure 90 includes two wells each including a 7-nm-thick Ga$_{0.63}$In$_{0.37}$N$_{0.009}$As$_{0.975}$Sb$_{0.016}$, and a pair of 20-nm-thick GaN$_{0.018}$As$_{0.982}$ barrier layer. The GaInNAsSb well layers were grown under the following conditions:

Chamber pressure—9.5×10$^{-5}$ Torr;

Growth temperature—460 degrees C.;

AsH$_3$ flux after cracking—8.5×10$^{-5}$ Torr;

Growth rate of GaInNAsSb—2.1 μm/hour; and

Sb flux—6.0×10$^{-6}$ Torr.

The layer structure epitaxially grown was subjected to a heat treatment at a temperature of 700 degrees C.

Each pair in the top p-type DBR mirror includes a 110-nm-thick Al$_{0.9}$Ga$_{0.1}$As and a 94-nm-thick p-GaAs layer. The bottom of the top p-type DBR mirror is implemented by a 20-nm-thick AlAs layer 98 and a 90-nm-thick Al$_{0.9}$Ga$_{0.1}$As layer instead of the 110-nm-thick Al$_{0.9}$Ga$_{0.1}$As layer.

The bottom layers form a current confinement structure implemented by a non-oxidized area of the AlAs layer 98 which functions as a current injection area 100, and an oxidized area of the AlAs layer 98 wherein Al in the AlAs layer 98 is oxidized.

Among the layer structure as described above, the top DBR mirror 94 is configured by a photolithographic etching technique to form a annular groove 102 having a width of, for example, 50 μm. The annular groove 102 defines a cylindrical mesa post having a diameter of 20 μm. By oxidizing Al in the selected area of the AlAs layer 98 outside the periphery of the mesa post, the current confinement structure is formed which includes the current injection area 98 having a diameter of 8 μm and the Al-oxidized area 100.

A SiN$_x$ film 104 is formed as an insulation layer for the entire layer structure including the annular groove 102 and except for the top of the mesa post. An annular p-side electrode 106 is formed inside the SiNx film 104 in contact with the p-GaAs cap layer 96. An electrode pad 108 made of Ti/Pt/Au films is formed on the annular p-side electrode 106 and the SiNx film 104. The bottom of the GaAs substrate 82 is polished for allowing the GaAs substrate 82 to have a thickness of 100 μm. An n-side electrode 110 is formed on the bottom surface of the GaAs substrate 82.

With the configuration as described above, the semiconductor laser device lased with a CW mode at a threshold current of 2 mA and at a temperature of 100 degrees C. or above.

In the examples of the first through third embodiments, the semiconductor laser devices had emission wavelengths of 1200 nm and 1250 to 1300 nm. The present invention can be applied to a semiconductor laser device or VCSEL having emission wavelengths of 980 nm, 1480 nm, 1550 nm, 1650 nm etc. by modifying the nitrogen content and the Sb content.

Since the above embodiments are described only for examples, the present invention is not limited to the above embodiments and various modifications or alterations can be easily made therefrom by those skilled in the art without departing from the scope of the present invention.

What is claimed is:

1. A semiconductor laser comprising:
   a substrate;
   a quantum well (QW) active layer structure formed over said substrate, wherein said QW active layer structure includes at least one QW layer comprising Ga$_x$In$_{1-x}$As$_y$Sb$_{1-y}$ to suppress three-dimensional growth of the at least one QW layer, and wherein $0.3 \leq 1-x$ and wherein $0.003 \leq 1-y \leq 0.008$.

2. The semiconductor laser of claim 1, wherein said substrate comprises GaAs.

3. The semiconductor laser of claim 1, wherein said laser emits laser light having a wavelength of at least about 1.18 μm.

4. The semiconductor laser of claim 1, wherein said semiconductor laser comprises a Vertical Cavity Surface Emitting Laser (VCSEL).

5. The semiconductor laser of claim 4 comprising at least two QW layers of Ga$_x$In$_{1-x}$As$_y$Sb$_{1-y}$.

6. The semiconductor laser of claim 1, wherein said semiconductor laser comprises an edge emitting laser.

7. A semiconductor laser comprising:
   a substrate;
   a quantum well (QW) active layer structure formed over said substrate, wherein said QW active layer structure includes at least one QW layer comprising Ga$_x$In$_{1-x}$As$_{1-y1-y2}$Sb$_{y2}$ to suppress three-dimensional growth of the at least one QW layer, wherein $0.3 \leq 1-x$, wherein $0 \leq y1 \leq 0.03$, and wherein $0.002 \leq y2 \leq 0.06$.

8. The semiconductor laser of claim 7, wherein said substrate comprises GaAs.

9. The semiconductor laser of claim 7, wherein said laser emits laser light having a wavelength of at least about 1.24 μm.

10. The semiconductor laser of claim 7, wherein said semiconductor laser comprises a Vertical Cavity Surface Emitting Laser (VCSEL).

11. The semiconductor laser of claim 10 comprising at least two QW layers of $Ga_xIn_{1-x}As_{1-y1-y2}N_{y1}Sb_{y2}$.

12. The semiconductor laser of claim 7, wherein said semiconductor laser comprises an edge emitting laser.

13. The semiconductor laser of claim 7, wherein at least one of said active layers is placed between barrier layers of $GaN_zAs_{1-z}$.

14. The semiconductor laser of claim 13, wherein $0 \leq z \leq 0.05$.

15. A semiconductor laser comprising:

an active layer comprising GaAsInNSb, a quantity of Sb selected to reduce three-dimensional growth of the active layer, and a quantity of In selected to provide longer wavelength operation of the semiconductor laser; and a pair of barrier layers, one on each side of said active layer, said barrier layers comprising GaAsN.

16. The semiconductor laser of claim 15, wherein said substrate comprises GaAs.

17. The semiconductor laser of claim 15, wherein said semiconductor laser has a lasing wavelength of at least about 1.24 μm.

18. The semiconductor laser of claim 15, wherein said semiconductor laser comprises a Vertical Cavity Surface Emitting Laser (VCSEL).

19. The semiconductor laser of claim 15, wherein said semiconductor laser comprises an edge emitting laser.

* * * * *

UNITED STATES PATENT AND TRADEMARK OFFICE
CERTIFICATE OF CORRECTION

PATENT NO.   : 6,912,236 B2
DATED        : June 28, 2005
INVENTOR(S)  : Hiroshi Shimizu et al.

It is certified that error appears in the above-identified patent and that said Letters Patent is hereby corrected as shown below:

<u>Column 14,</u>
Lines 62-63, change "$Ga_xIn_{1-x}As_{1-y1-y2y1}Sb_{y2}$" to read -- $Ga_xIn_{1-x}As_{1-y1-y2}N_{y1}Sb_{y2}$ --.

<u>Column 15,</u>
Line 8, change "$Ga_xIn_{1-x}As_{1-y1-y}2N_{y1}Sb_{y2}$" to read -- $Ga_xIn_{1-x}As_{-y1-y2}N_{y1}Sb_{y2}$ --.

Signed and Sealed this

Eleventh Day of April, 2006

JON W. DUDAS
*Director of the United States Patent and Trademark Office*